(12) United States Patent
Chang et al.

(10) Patent No.: US 9,368,357 B2
(45) Date of Patent: Jun. 14, 2016

(54) DIRECTIONAL PRE-CLEAN IN SILICIDE AND CONTACT FORMATION

(71) Applicant: Taiwan Semiconductor Manufacturing Company, Ltd., Hsin-Chu (TW)

(72) Inventors: Chih-Wei Chang, Hsin-Chu (TW); Hung-Chang Hsu, Hsin-Chu (TW); Chun-Hsien Huang, Hsin-Chu (TW); Yu-Hung Lin, Hsin-Chu (TW); Li-Wei Chu, Hsin-Chu (TW); Sheng-Hsuan Lin, Hsin-Chu (TW); Wei-Jung Lin, Hsin-Chu (TW); Yu-Shiuan Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/982,592

(22) Filed: Dec. 29, 2015

(65) Prior Publication Data

US 2016/0126102 A1    May 5, 2016

Related U.S. Application Data

(63) Continuation of application No. 14/527,300, filed on Oct. 29, 2014, now Pat. No. 9,230,795.

(51) Int. Cl.
| | | |
|---|---|---|
| *H01L 21/00* | (2006.01) |
| *H01L 21/44* | (2006.01) |
| *H01L 21/285* | (2006.01) |
| *H01L 21/306* | (2006.01) |
| *H01L 21/265* | (2006.01) |
| *H01L 21/324* | (2006.01) |
| *H01L 21/225* | (2006.01) |
| *H01L 29/66* | (2006.01) |
| *H01L 21/768* | (2006.01) |

(52) U.S. Cl.
CPC ...... *H01L 21/28518* (2013.01); *H01L 21/2253* (2013.01); *H01L 21/26586* (2013.01); *H01L 21/30604* (2013.01); *H01L 21/324* (2013.01); *H01L 21/76897* (2013.01); *H01L 29/665* (2013.01)

(58) Field of Classification Search
CPC .................... H01L 21/02063; H01L 21/02359
USPC ........................................................ 438/155
See application file for complete search history.

(56) References Cited

U.S. PATENT DOCUMENTS 7,348,233 B1    3/2008  Gerhardt et al.

OTHER PUBLICATIONS

Deenapanray, et al., "Electrical characterization and annealing behavior of defect introduced in Si during sputter etching in an Ar plasma," JVSTB, Journal of Vacuum Science and Technology B, 16, 1873, May 1998, 9 pages.

(Continued)

*Primary Examiner* — David S Blum
(74) *Attorney, Agent, or Firm* — Slater Matsil, LLP

(57) ABSTRACT

A method includes etching a dielectric layer to form an opening, with an underlying region underlying the dielectric layer exposed to the opening, and performing a bombardment to bombard a surface region of the underlying region through the opening. After the bombardment, the surface region is reacted with a process gas to form a reaction layer. An anneal is then performed to remove the reaction layer.

20 Claims, 22 Drawing Sheets

(56) References Cited

OTHER PUBLICATIONS

Grusell, et al., "Electrical Defects in Silicon Introduced by Sputtering and Sputter-Etching," ecsdl.org/site/terms_use, J. Electrochem. Soc.: Solid-State Science and Technology, vol. 127, No. 7, Jul. 1980, pp. 1573-1576.

Zhu et al., "Electrical characterization of Ar-ion-bombardment-induced damage in Au/Si and PtSi/Si Schottky barrier contacts," Institute of Physics Publishing, Semiconductor Science and Technology, Semicond. Sci. Technol. 16, www.op.org/Journals/ss, PII: S0268-1242(01)15697-X, Feb. 2001, pp. 83-90.

ially aligned with# DIRECTIONAL PRE-CLEAN IN SILICIDE AND CONTACT FORMATION

PRIORITY CLAIM AND CROSS-REFERENCE

This application is a continuation of U.S. patent application Ser. No. 14/527,300, now U.S. Pat. No. 9,230,795, entitled "Direction Pre-Clean in Silicide and Contact Formation," filed on Oct. 29, 2014, which application is incorporated herein by reference.

BACKGROUND

Transistors typically include semiconductor regions used to form the source regions and drain regions. The contact resistance between metal contact plugs and the semiconductor regions is high. Accordingly, metal silicides are formed on the surfaces of the semiconductor regions such as silicon regions, germanium regions, silicon germanium regions in order to reduce the contact resistance. The contact plugs are formed to contact the silicide regions, and the contact resistance between the contact plugs and the silicide regions are low.

A typical silicidation process includes performing a pre-clean, forming a metal layer on the surfaces of the semiconductor regions, and then performing an annealing, so that the metal layer reacts with the semiconductor regions to form the silicide regions. After the reaction, the upper portions of the metal layer may be left un-reacted. An etching step is then performed to remove the un-reacted portions of the metal layer, and the silicide regions are left.

With the increasing down-sizing of integrated circuits, the silicide regions also become increasingly smaller. Accordingly, the contact resistance of the electrical contacts becomes increasingly higher.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
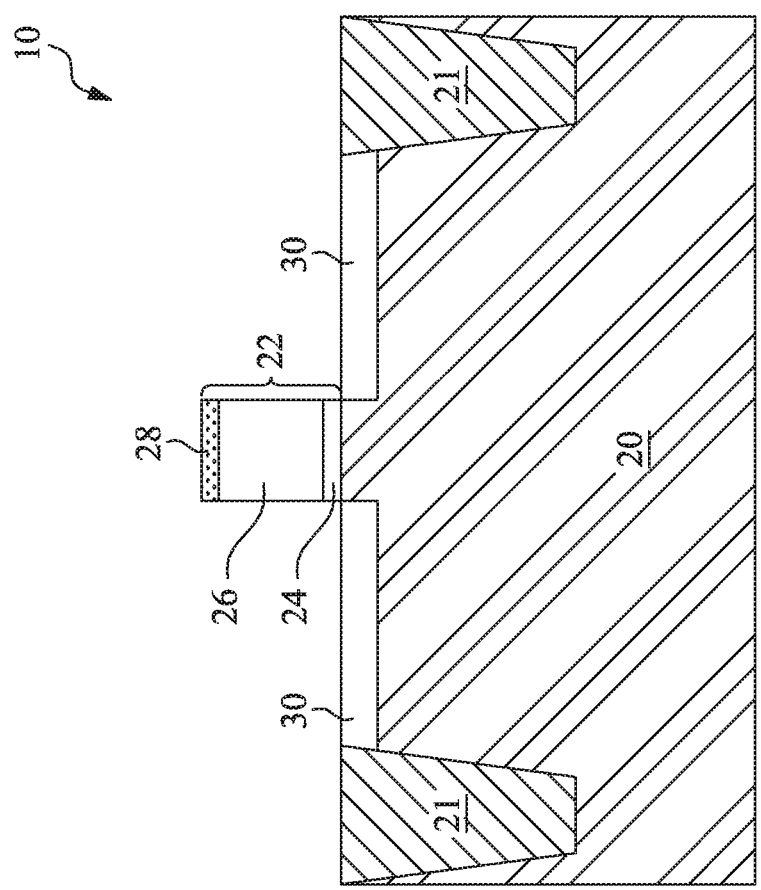
FIGS. 1 through 16 illustrate the cross-sectional views of intermediate stages in the formation of a Metal-Oxide-Semiconductor (MOS) device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A process for forming a Metal-Oxide-Semiconductor (MOS) device is provided in accordance with various exemplary embodiments. The intermediate stages of forming the MOS device are illustrated. The variations of the embodiments are discussed. Throughout the various views and illustrative embodiments, like reference numbers are used to designate like elements.

Figure 22:
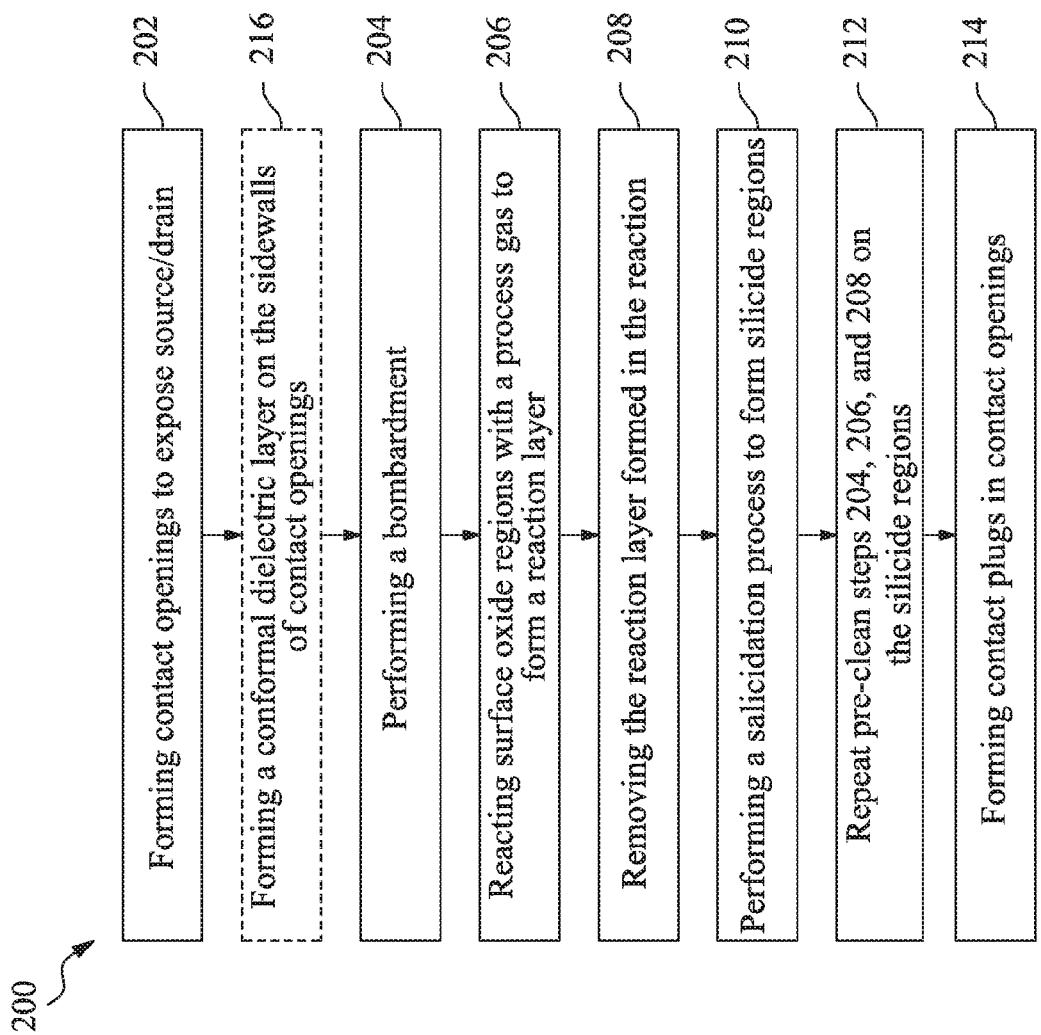
FIG. 22 illustrates a process flow for forming a MOS device in accordance with some embodiments.

FIGS. 1 through 16 illustrate the cross-sectional views of intermediate stages in the formation of a MOS device in accordance with some embodiments of the present disclosure. The steps shown in FIG. 1 through 16 are also illustrated schematically in the process flow 200 shown in FIG. 22. In the subsequent discussion, the process steps shown in FIGS. 1 through 16 are discussed referring to the process steps in FIG. 22.

FIG. 1 illustrates substrate 20, which is a portion of wafer 10. Substrate 20 may be a bulk semiconductor substrate such as a crystalline silicon substrate, or may have a composite structure, such as a Silicon-On-Insulator (SOI) structure. Alternatively, other semiconductor materials that include group IIIA elements, group IVA elements, and/or group VA elements may also be comprised in substrate 20, which semiconductor materials may include silicon germanium, silicon carbon, and/or III-V compound semiconductor materials.

Gate stack 22 is formed over substrate 20. Gate stack 22 includes gate dielectric 24 and gate electrode 26. Gate dielectric 24 may comprise silicon oxide, silicon nitride, and/or a high-k dielectric material having a high k value, for example, higher than about 7. For example, the high-k dielectric material may include hafnium oxide, lanthanum oxide, aluminum oxide, combinations thereof, and/or multi-layers thereof. Gate electrode 26 may be a metal gate including, for example, TiAl, cobalt, aluminum, titanium nitride, tantalum nitride, etc, and may include multiple layers of different materials. Depending on whether the respective MOS device is a P-type Metal-Oxide-Semiconductor (PMOS) transistor or an N-type Metal-Oxide-Semiconductor (NMOS) transistor, the materials of gate electrode 26 are selected to have a high work function or a low work function, respectively. Gate stack 22 may also include hard mask 28, which may be formed silicon nitride, for example, although other materials such as silicon carbide, silicon oxynitride, and the like may also be used. In the embodiments in which replacement gates are formed, hard mask 28 may be, or may not be, formed.

As also shown in FIG. 1, Lightly Doped Drain/source (LDD) regions 30 are formed, for example, by implanting a p-type impurity such as boron and/or indium or an n-type impurity such as phosphorous and/or arsenic into substrate 20. Gate stack 22 acts as an implantation mask so that the inner edges of LDD regions 30 are substantially aligned with the edges of gate stack 22. The LDD implantation may be tilted or vertical, with the tilt angle smaller than about 30 degrees. In addition, pocket regions (not shown) may also be formed, for example, by implanting an n-type impurity such as arsenic or phosphorous or a p-type impurity such as boron into substrate 20, wherein the conductivity type of the implanted impurity for the pocket implantation is opposite to that of LDD regions 30. The pocket implantation may be tilted, with the tilt angle greater than the tilt angle of the LDD implantation. In some embodiments, the tilt angle of the pocket implantation is between about 15 degrees and about 45 degrees.

Figure 2:
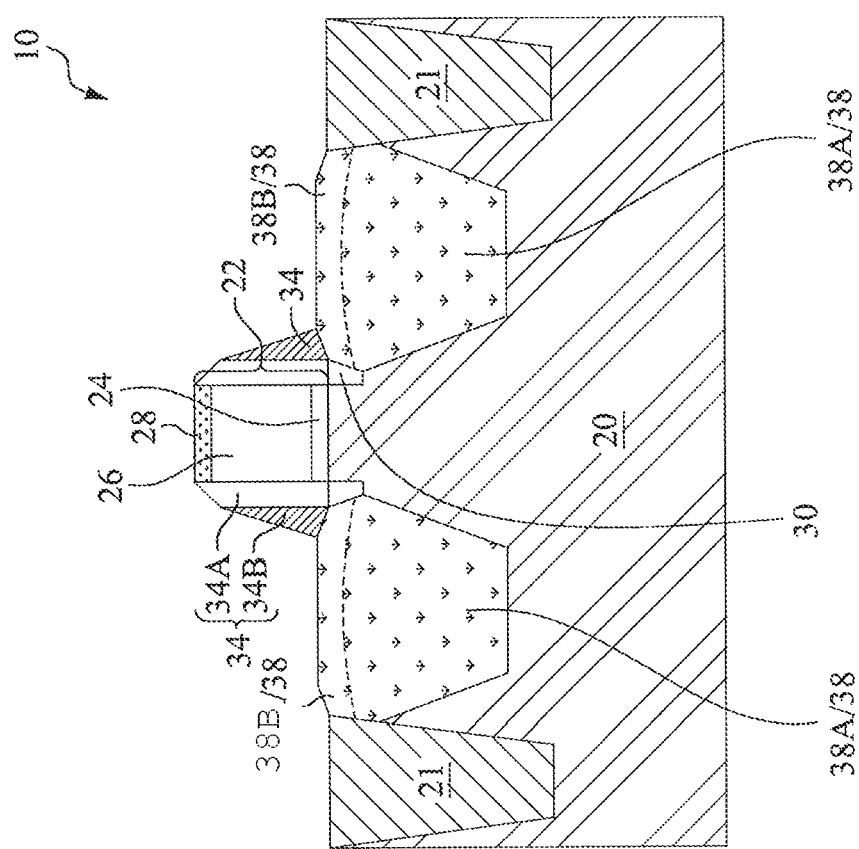

As shown in FIG. 2, gate spacers 34 are formed on the sidewalls of gate dielectric 24 and gate electrode 26. In some embodiments, each of gate spacers 34 includes a silicon oxide layer 34A and a silicon nitride layer 34B over the silicon oxide layer, wherein the silicon oxide layer may have a thickness between about 15 Å and about 50 Å, and the thickness of the silicon nitride layer may be between about 50 Å and about 200 Å. It is appreciated that the values recited throughout the description are examples, and may be changed to different values. Silicon nitride layer 34B may also overlap a horizontal leg of silicon oxide layer 34A in some embodiments.

In alternative embodiments, gate spacers 34 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

Source and drain regions (referred to as source/drain regions hereinafter) 38 are formed in semiconductor substrate 20. In the embodiments wherein MOS device 100 (FIG. 16) is a PMOS device, source/drain regions 38 are of p-type. In the embodiments wherein MOS device 100 is an NMOS device, source/drain regions 38 are of n-type. In some embodiments, source/drain stressors (also marked as 38) are formed in semiconductor substrate 20. The source/drain stressors form at least parts of source/drain regions 38. FIG. 2 illustrates the embodiments in which source/drain regions 38 fully overlap the respective source/drain stressors. In alternative embodiments, source/drain regions 38 and the source/drain stressors are partially overlapped.

Furthermore, in the embodiments in which MOS device 100 (FIG. 16) is an NMOS device, source/drain stressors 38 may comprise silicon phosphorous (SiP), silicon carbon (SiC), or the like. In the embodiments in which MOS device 100 is a PMOS device, source/drain stressors 38 may comprise silicon germanium boron (SiGeB). The formation of source/drain stressors 38 may be achieved by etching semiconductor substrate 20 to form recesses therein, and then performing an epitaxy to grow source/drain stressors 38 in the recesses.

In accordance with some embodiments of the present disclosure, source/drain regions 38 include lower portions 38A and silicon caps 38B overlapping the respective lower portions 38A. For example, when lower portions 38A comprise silicon germanium, silicon caps 38B may be formed over lower portions 38A to improve the quality of the subsequently formed source/drain silicide regions. Silicon caps 38B may be formed of silicon and free from germanium. In accordance with alternative embodiments, silicon caps 38B are silicon germanium regions with a germanium percentage lower than the germanium percentage in lower portions 38A.

Figure 3:
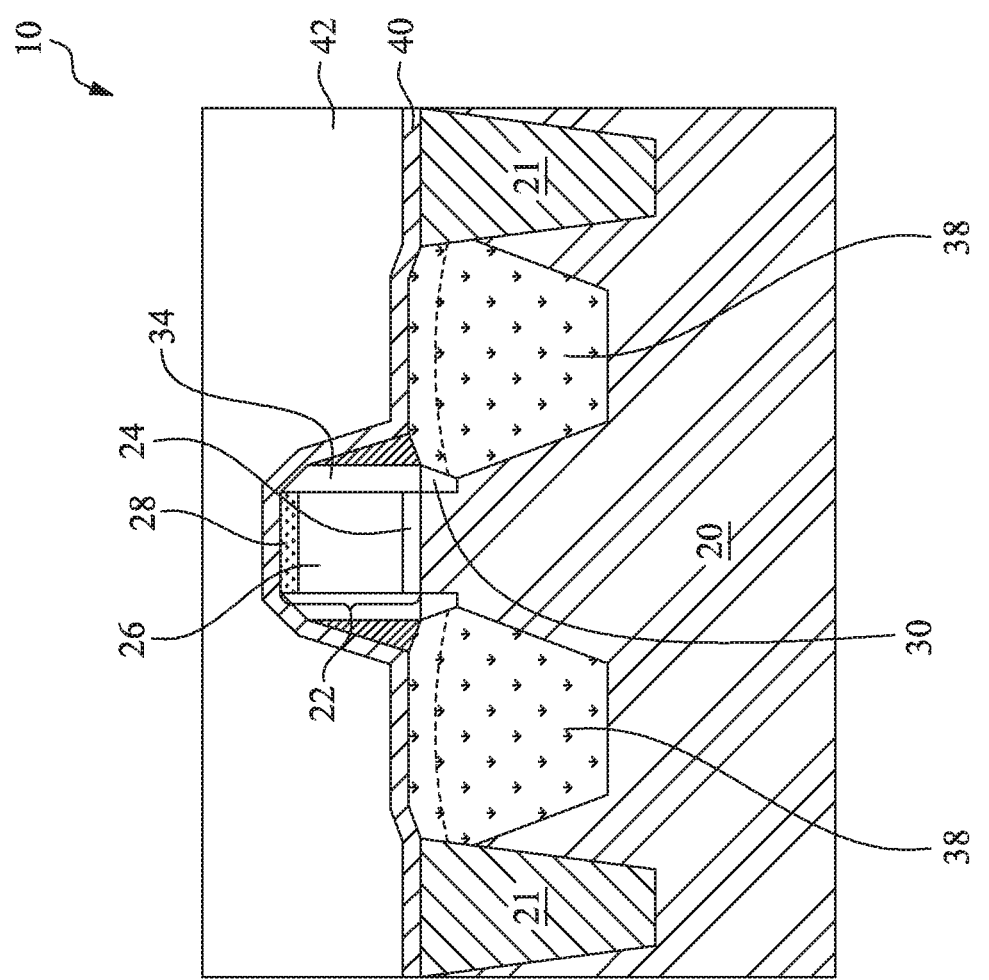

Referring to FIG. 3, Contact Etch Stop Layer (CESL) 40 is formed over gate stack 22 and source/drain regions 38. In some embodiments, CESL 40 comprises silicon nitride, silicon carbide, or other dielectric materials. Inter-Layer Dielectric (ILD) 42 is form over CESL 40. ILD 42 is blanket formed to a level higher than the top surface of gate stack 22. ILD 42 may comprise Flowable oxide formed using, for example, Flowable Chemical Vapor Deposition (FCVD). ILD 42 may also be a spin-on dielectric formed using spin-on coating. For example, ILD 42 may comprise Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, or other low-k non-porous dielectric materials.

Figure 4:
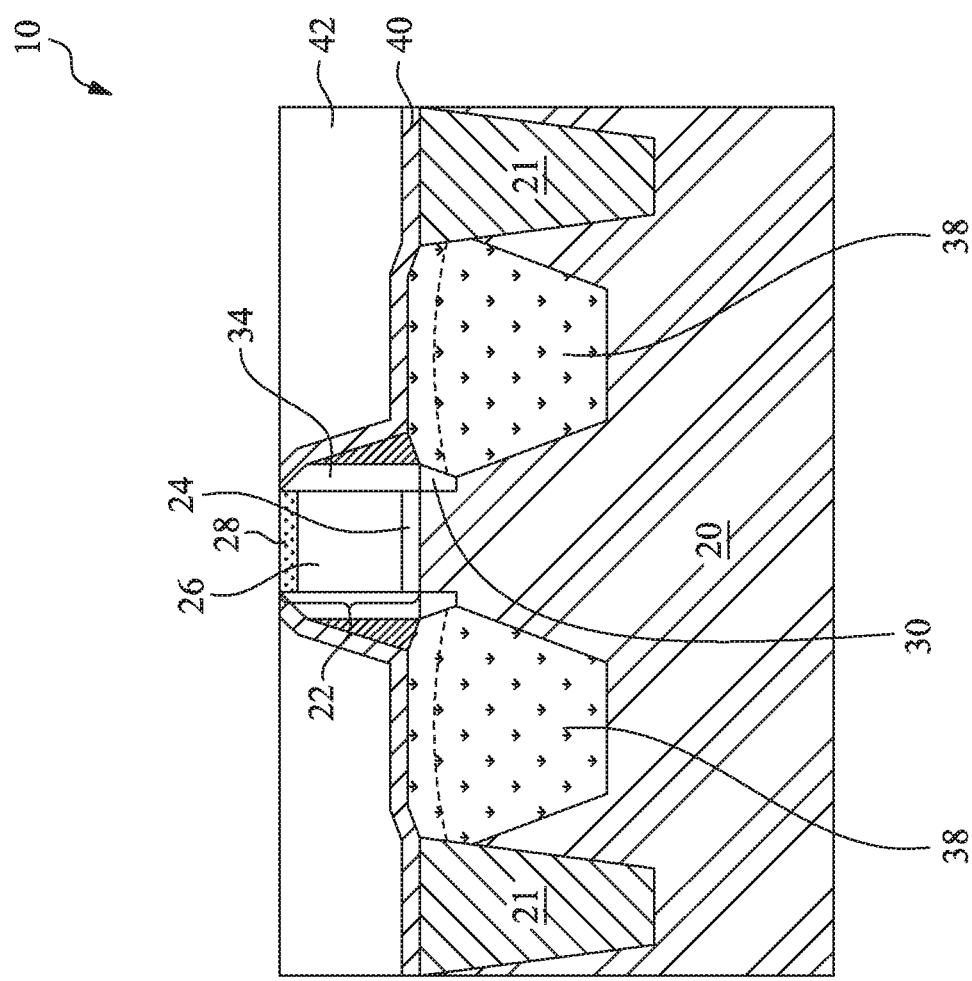

FIG. 4 illustrates a planarization step, which is performed using, for example, Chemical Mechanical Polish (CMP). The CMP is performed to remove excess portions of ILD 42 and CESL 40, wherein the excess portions are over the top surface of hard mask 28. Accordingly, dummy gate stack 22 is exposed. In alternative embodiments, hard mask 28 is removed during the CMP, wherein the CMP stops on the top surface of dummy gate electrode 26.

Figure 5:
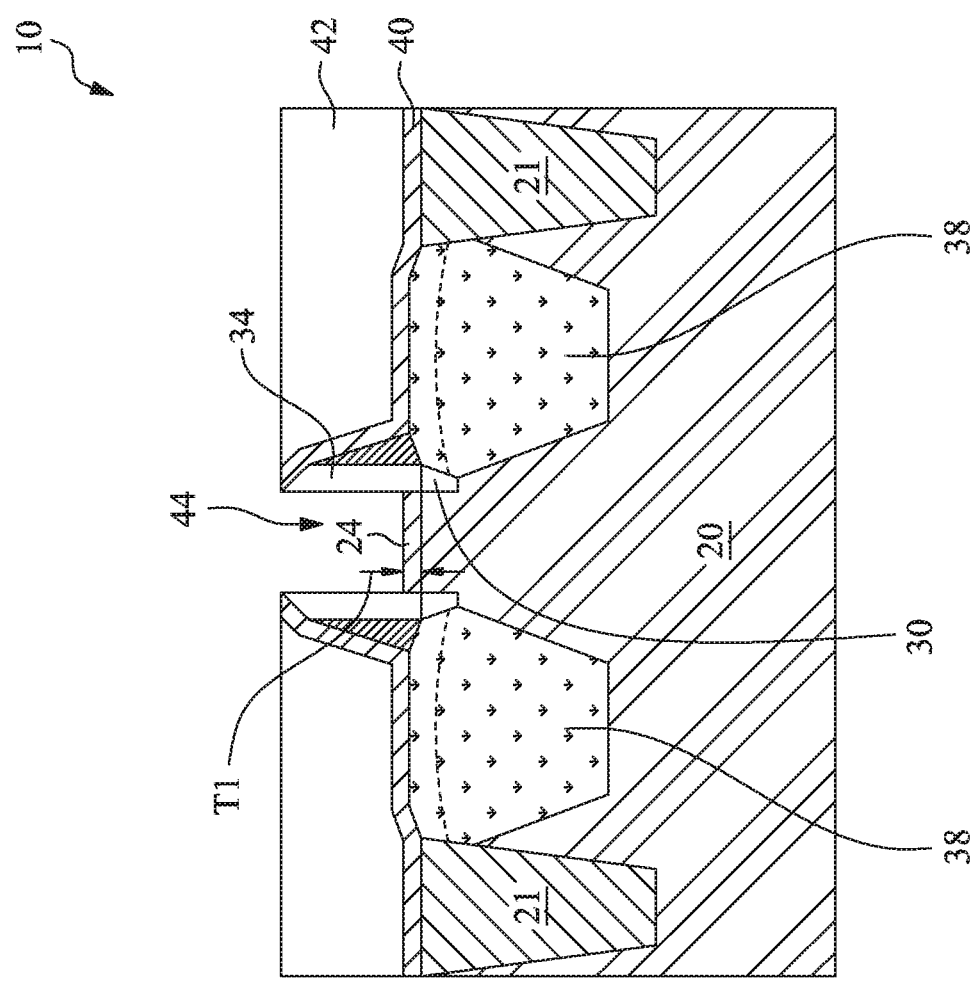
Figure 6:
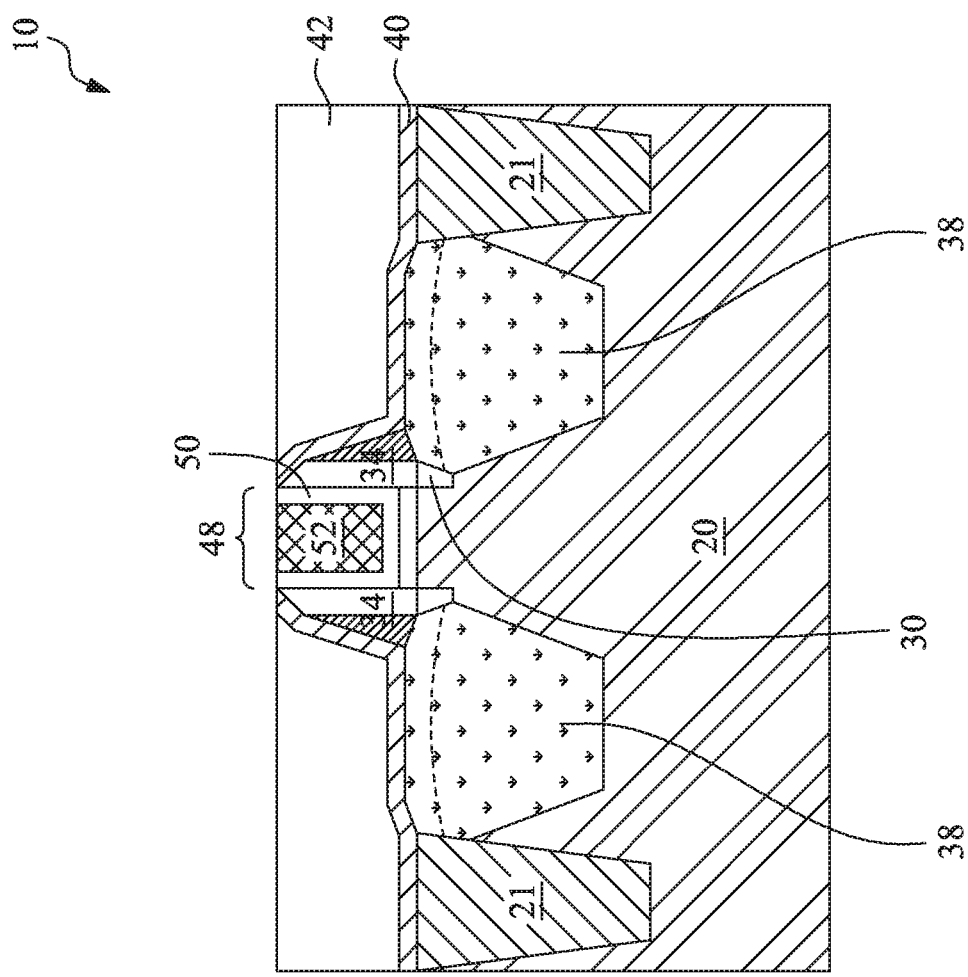

In the embodiments in which gate stack 22 is a dummy gate, it is replaced with a replacement gate, as shown in FIGS. 5 and 6. In alternative embodiments, gate stack 22 is the final gate in the product, and is not replaced with a replacement gate. Referring to FIG. 5, dummy gate stack 22 is at least partially removed. Recess 44 is formed as a result of the removal of dummy gate stack 22, wherein the resulting structure is shown in FIG. 5. For example, hard mask 28 (if not removed yet) and dummy gate electrode 26 are removed. Dummy gate dielectric 24 may be partially etched to remove its top portion, and a bottom portion of dummy gate dielectric 24 is left. Alternatively, dummy gate dielectric 24 is fully removed. In some exemplary embodiments, thickness T1 of the remaining portion of dummy gate dielectric 24 is in the range between about 100 Å and about 200 Å.

FIG. 6 illustrates the formation of replacement gate stack 48, which includes gate dielectric 50 and gate electrode 52 over gate dielectric 50. In some embodiments, gate dielectric 50 includes an interfacial dielectric such as silicon oxide, which may be formed through the thermal oxidation of substrate 20, a chemical reaction, or a deposition step. Gate dielectric 50 may also include a high-k dielectric layer (the upper part of gate dielectric layer 50) comprising a high-k dielectric material such as hafnium oxide, lanthanum oxide, aluminum oxide, or the like. The dielectric constant (k-value) of the high-k dielectric material is higher than 3.9, and may be higher than about 7.0, and sometimes as high as 21.0 or higher. The high-k dielectric layer is overlying, and may contact, the interfacial dielectric.

A diffusion barrier/adhesion layer, which may include TiN, TaN, or composite layers thereof, may be formed as a bottom layer of gate electrode 52. Gate electrode 52 may also include a P-work-function metal layer or an N-work-function metal layer. For example, when MOS device 100 (FIG. 16) is an NMOS device, the N-work-function metal layer is formed, and the work function of the gate electrode 52 may be lower than about 4.2 eV. The exemplary N-work-function metals include TiN, for example. When MOS device 100 is a PMOS device, the P-work-function metal is used, and the work function of the gate electrode 52 may be higher than about 4.7 eV. The exemplary P-work-function metals include TaC, TiAl, Ti, TiAlN, TaSiN, TaCN, combinations thereof, and multilayers thereof.

Gate electrode 52 may also comprise aluminum, for example. The formation of gate dielectric 50 and gate electrode 52 may include Physical Vapor Deposition (PVD), Metal-Organic Chemical Vapor Deposition (MOCVD), and/ or other applicable methods, depending on the materials of gate dielectric 50 and gate electrode 52.

Figure 7:
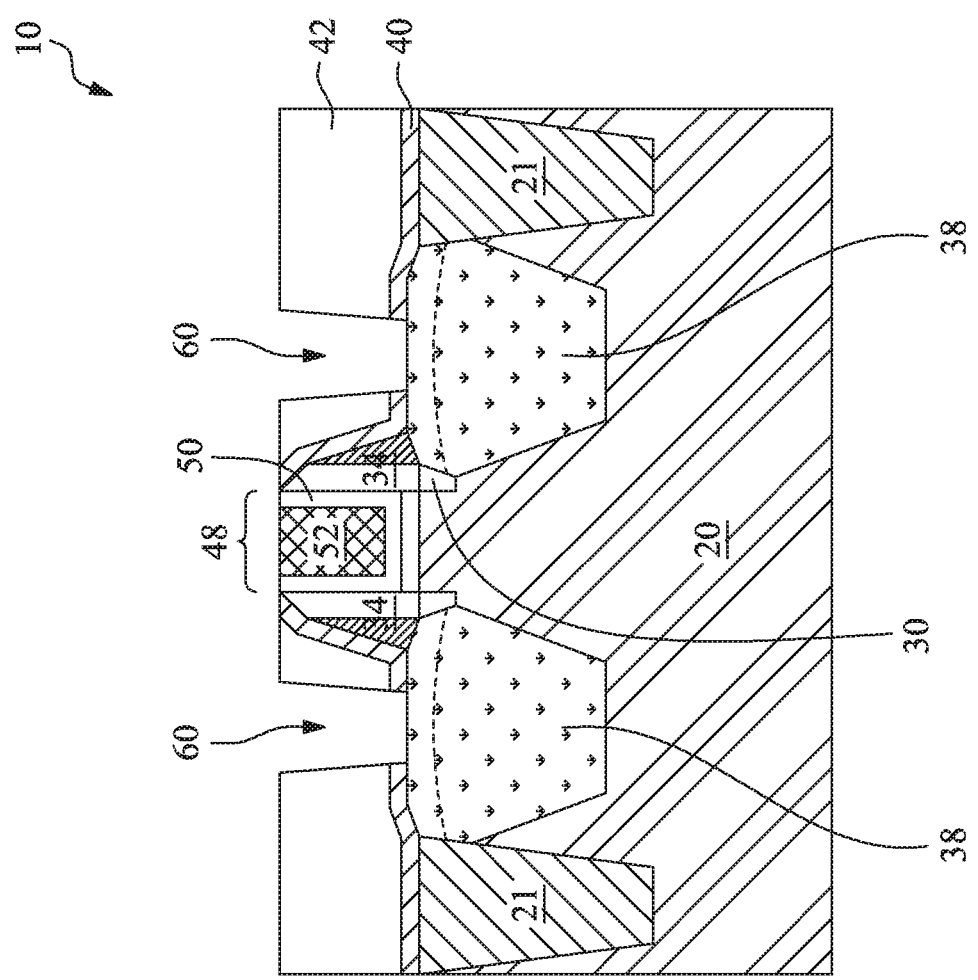

Referring to FIG. 7, contact openings 60 are formed to penetrate through ILD 42 and CESL 40, so that source/drain regions 38 are exposed. The respective step is shown as step 202 in the process flow in FIG. 22. In accordance with some embodiments, the etching is performed using Deep Reactive-Ion Etching (DRIE), and hence the etching is anisotropic. As a result, the sidewalls of contact openings 60 are vertical, although there may be a small tilt angle.

Figure 8:
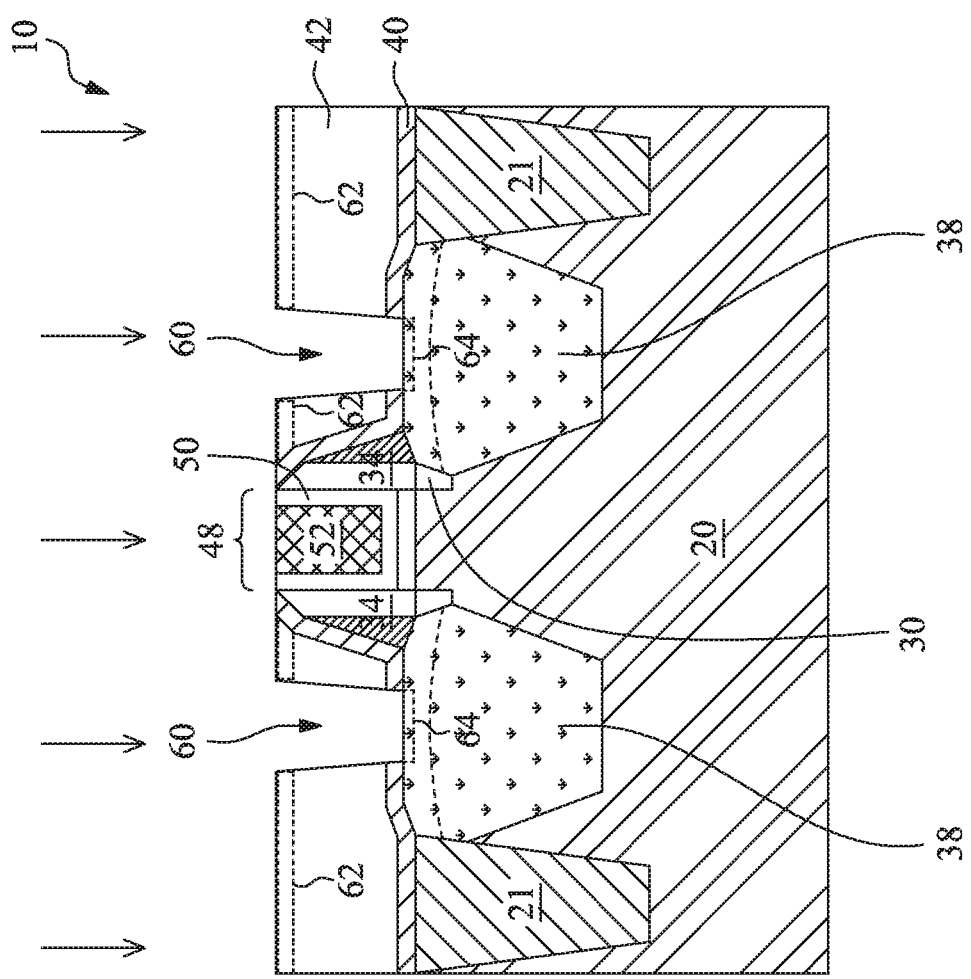
Figure 9:
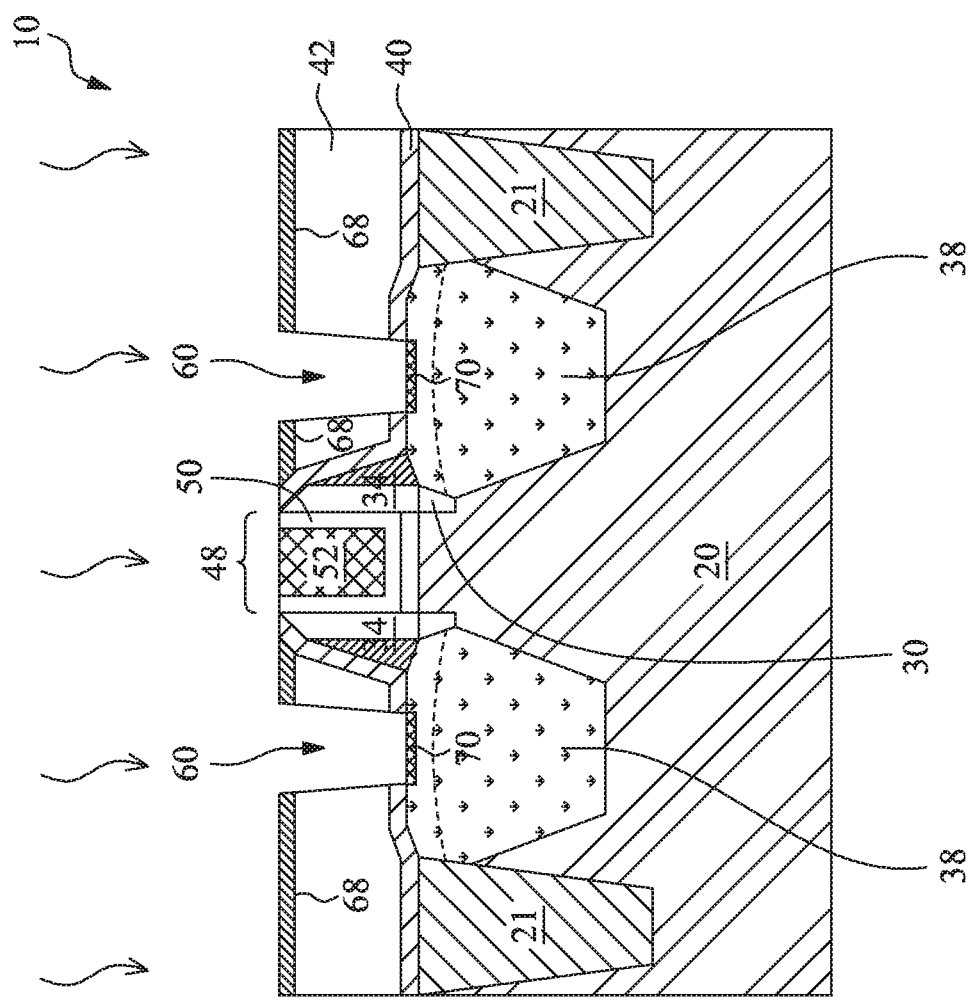
Figure 10:
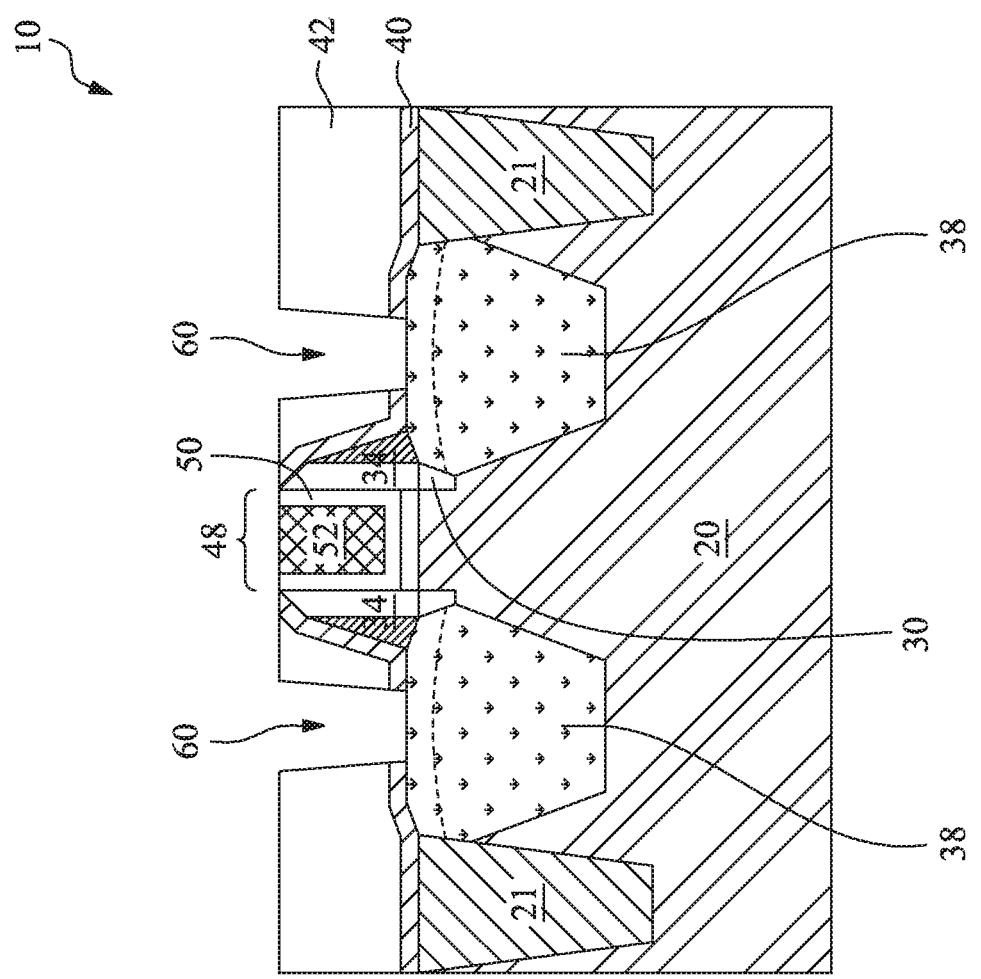

FIGS. 8 through 10 illustrate a pre-clean process to clean the surface of exposed source/drain regions 38, wherein the pre-clean is used to remove the native oxide on the surfaces of the exposed source/drain regions 38. For example, the native oxide may include silicon oxide ($SiO_2$). FIG. 8 illustrates an ion bombardment (represented by arrows) on wafer 10. The respective step is shown as step 204 in the process flow in FIG. 22. The ion bombardment is vertical, so that the top surface of ILD 40 and source/drain regions 38 are bombarded, while the sidewalls of contact openings 60 are not bombarded. In accordance with some embodiments, the ion bombardment is performing using a process gas selected from argon, helium, nitrogen ($N_2$), hydrogen ($H_2$), xenon, arsenic, germanium, phosphorous, and the like, with ions generated from the process gas and used to bombard wafer 10. The bombardment is performed in a vacuumed environment (such as a chamber), wherein the flow rate of the process gas may be in the range between about 1 sccm and about 20,000 sccm. The pressure of the process gas may be in the range between about 0.1 mtorr and about 1 torr. The bias may be between about 20 eV and about 5 KeV. The duration of the bombardment may be between about 1 second and about 90 seconds.

The surface regions that are bombarded are illustrated as regions 62 and 64, which are the top surface regions of ILD 42 and the top surface regions of source/drain regions 38, respectively. Regions 64 also represent the native oxide. As a result of the bombardment, surface regions 62 and 64 become rougher. In addition, the bonds of the materials (such as oxides) in the bombarded surface regions 62 and 64 may be broken or loosened. As a result, surface regions 62 and 64 may adsorb more process gases in the subsequent chemical reaction step. On the other hand, since the sidewalls of contact openings 60 are vertical, they are not bombarded or substantially not bombarded, and their ability for adsorb process gases is not increased.

In the bombardment, the ions may be implanted into source/drain regions 38. The implanted ions have the function of reducing the Schottky barrier between the subsequent formed silicide regions as well as contact plugs and source/drain regions 38. This may advantageously reduce the contact resistance of the contact plugs. The contact resistance may further be adjusted by adjusting the type of bombardment ions and the energy of the bombardment.

FIG. 9 illustrates the chemical reaction for reacting oxides in surface regions 62 and 64 (FIG. 8). The respective step is shown as step 206 in the process flow in FIG. 22. In accordance with some embodiments, the chemical reaction is performed using, for example, a process gas comprising $NF_3$ and $NH_3$, which process gas is also referred to as SiCoNi (a registered trade mark of Applied Materials, Inc.). In other embodiments, the chemical reaction is performed using a combined gas of $NF_3$ and $H_2$ or a combined gas of HF and $NH_3$. Plasma is generated from the process gas. In the reaction, the temperature of wafer 10 is higher than about 60° C., and may be in the range between about 60° C. and about 200° C. The reaction time may be in the range between about 1 second and about 300 seconds. The pressure of the process gases may be in the range between about 1 mtorr and about 20 torr.

In the chemical reaction, process gases $NF_3$ and $NH_3$ may form $NH_4F$ and $NH_4F \cdot HF$, which are in the gaseous form. The process gases are adsorbed by surfaces regions 62 and 64, and react with the silicon oxide in the surface regions, with the following reaction occurring in the chemical reaction:

$$NH_4F + NH_4F \cdot HF + SiO_2 \rightarrow (NH_4)_2 SiF_6 + H_2O \qquad [\text{Eq.1}]$$

$H_2O$ is in the form of vapor, and is removed. $(NH_4)_2 SiF_6$ is a solid that is formed wherever silicon oxide exists and the process gases are adsorbed. Accordingly, as shown in FIG. 9, layers 68 and 70 are formed, which comprise $(NH_4)_2 SiF_6$ in some embodiments. Layers 68 and 70 are also referred to reaction layers or sublimation layers throughout the description. The formation of layers 68 and 70 is accelerated since regions 62 and 64 (FIG. 8) may adsorb more process gases due to the bombardment. On the other hand, the sidewalls of contact openings 60 are not bombarded, and hence their adsorption ability of SiCoNi is not increased. Furthermore, in the chemical reaction, the temperature of wafer 10 is high (for example, higher than about 60° C.). When the temperature is higher than about 60° C., the increase in the temperature of wafer 10 causes the adsorption rate of the sidewalls of contact opening 60 to drop to a negligible level, and hence the reaction as shown in Equation 1 is also reduced to a negligible level. As a result, the reaction at the sidewalls of openings 60 is at least reduced, and possibly substantially eliminated. Although the increased temperature in wafer 10 also reduces the adsorption rate of regions 62 and 64 (FIG. 8), the reduction in the adsorption rate of regions 62 and 64 is compensated for by the bombardment.

Next, an anneal is performed on wafer 10 to remove reaction regions 68 and 70. The respective step is shown as step 208 in the process flow in FIG. 22. The anneal is performed at a temperature higher than about 100° C., and may be in the range between about 100° C. and about 300° C. The anneal time may be in the range between about 1 second and about 300 seconds. The anneal causes the sublimation of layers 68 and 70, with the chemical reaction expressed as follows:

$$(NH_4)_2 SiF_6 \rightarrow SiF_4 + NH_3 + HF \qquad [\text{Eq. 2}]$$

As a result, layers 68 and 70 are decomposed, and the product gases $SiF_4$, $NH_3$, and HF are removed. Accordingly, layers 68 and 70 are removed through the sublimation. The resulting structure is shown in FIG. 10.

Comparing to the embodiments shown in FIGS. 9 and 10, if no bombardment is performed to increase the adsorption ability of regions 62 and 64 over the adsorption ability of the sidewall portions of ILD 42, the chemical reaction (Equation 1) will also occur on the sidewall of contact openings 60. Since the reaction causes the oxide to be turned into the sublimation layer, which is then removed, the widths of contact openings 60 will be undesirably enlarged. The embodiments of the present disclosure thus help maintain the widths of contact openings 60 not enlarged.

Figure 11:
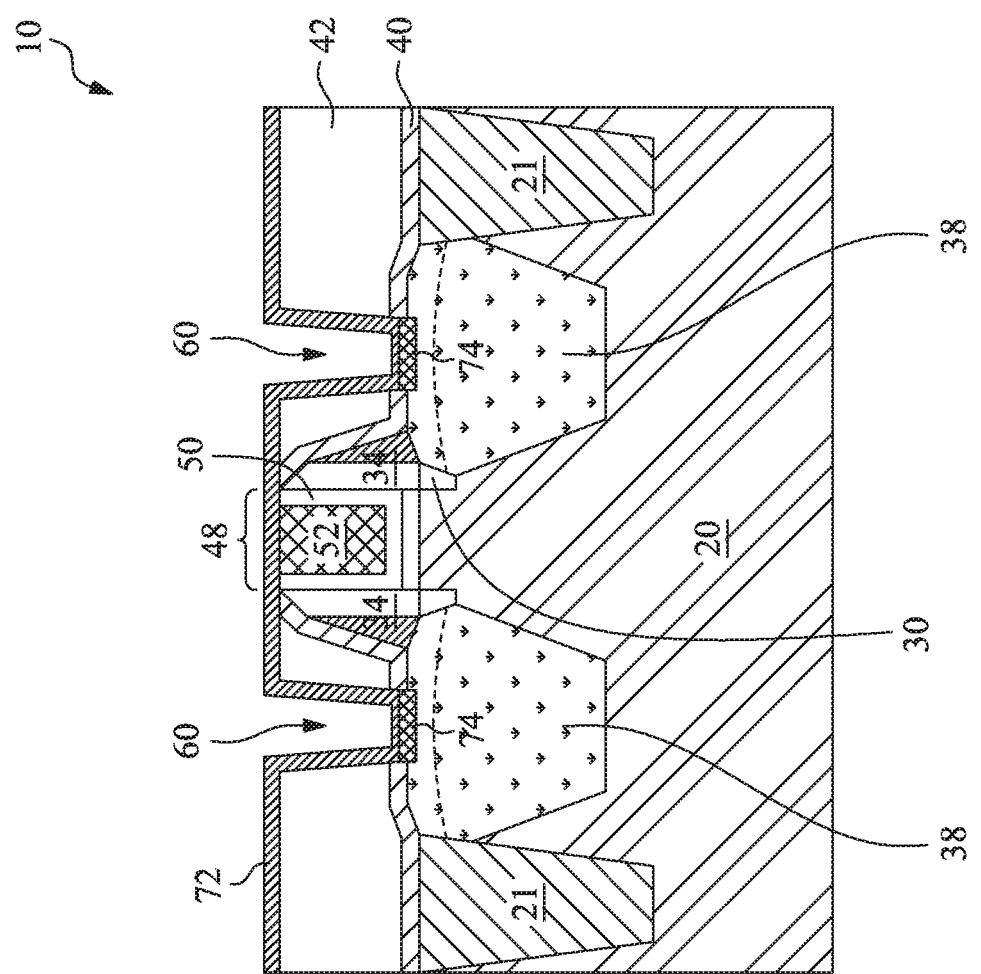
Figure 12:
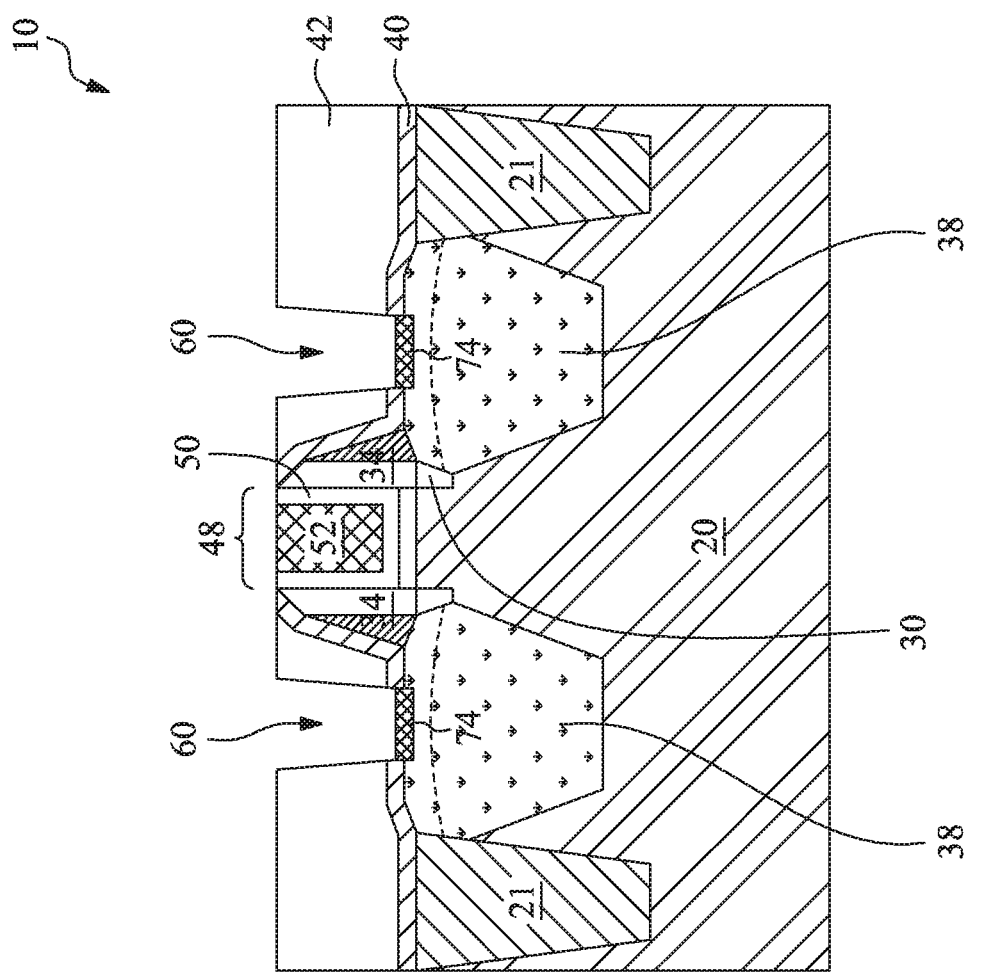

Referring to FIG. 11, metal layer 72 is formed as a blanket layer over wafer 10. Metal layer 72 may include nickel, cobalt, magnesium, tungsten, titanium, or the like. An anneal is then performed on wafer 10, causing the reaction of metal layer 72 with the surface portion of source/drain regions 38 to form silicide regions 74. Next, the unreacted portions of metal layer 72 are removed, leaving silicide regions 74, as shown in FIG. 12. The formation of silicide regions 74 is a self-aligned silicidation (silicidation) process. The respective step is shown as step 210 in the process flow in FIG. 22.

Figure 13:
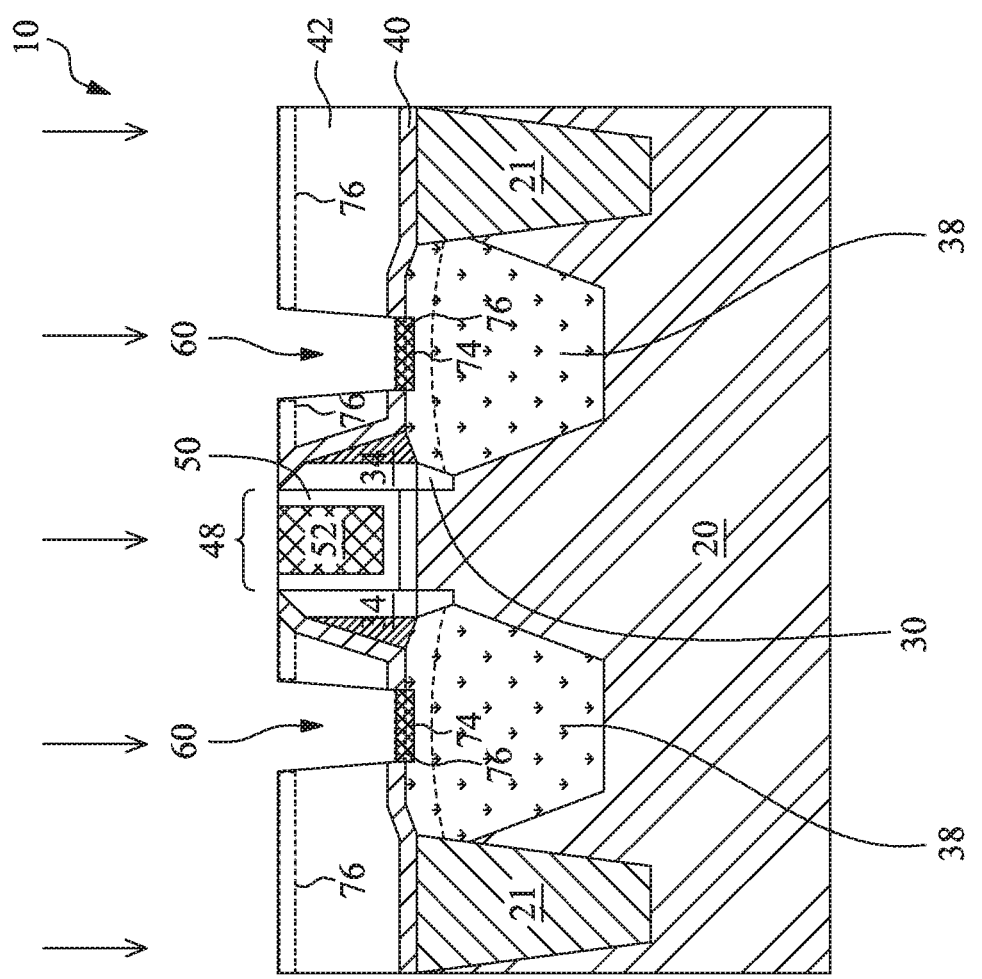
Figure 14:
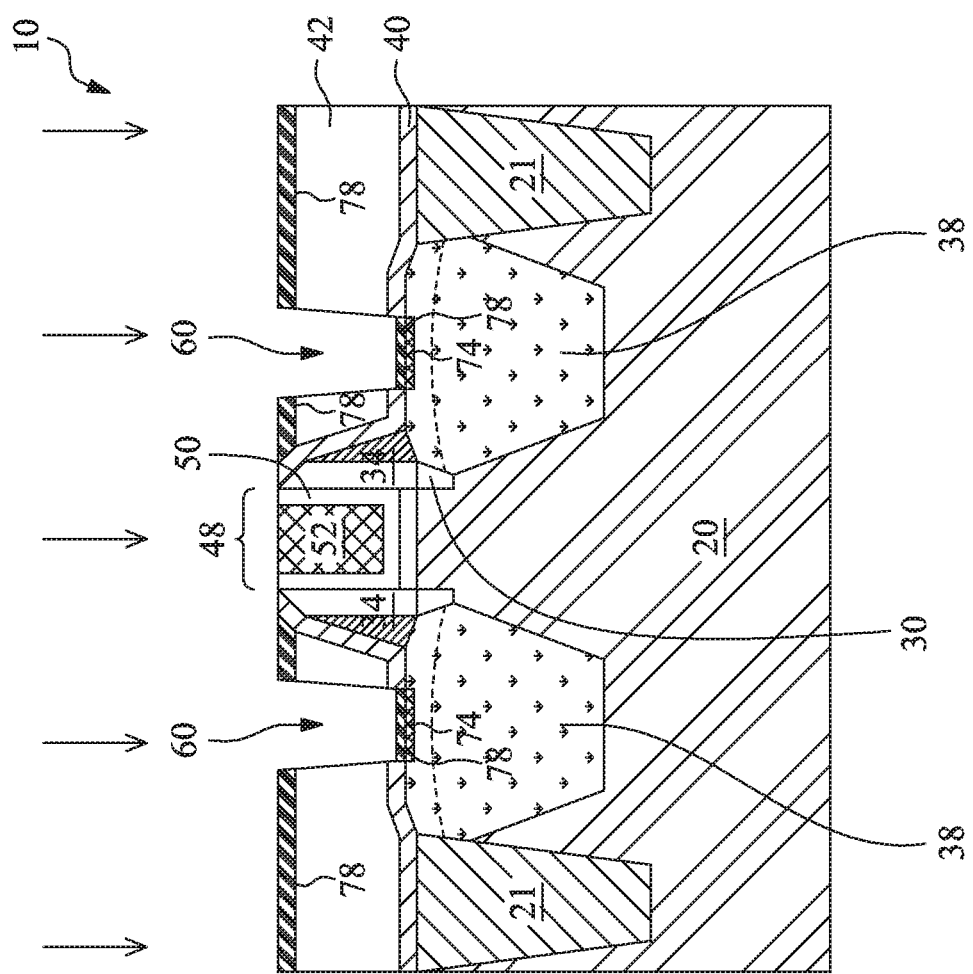
Figure 15:
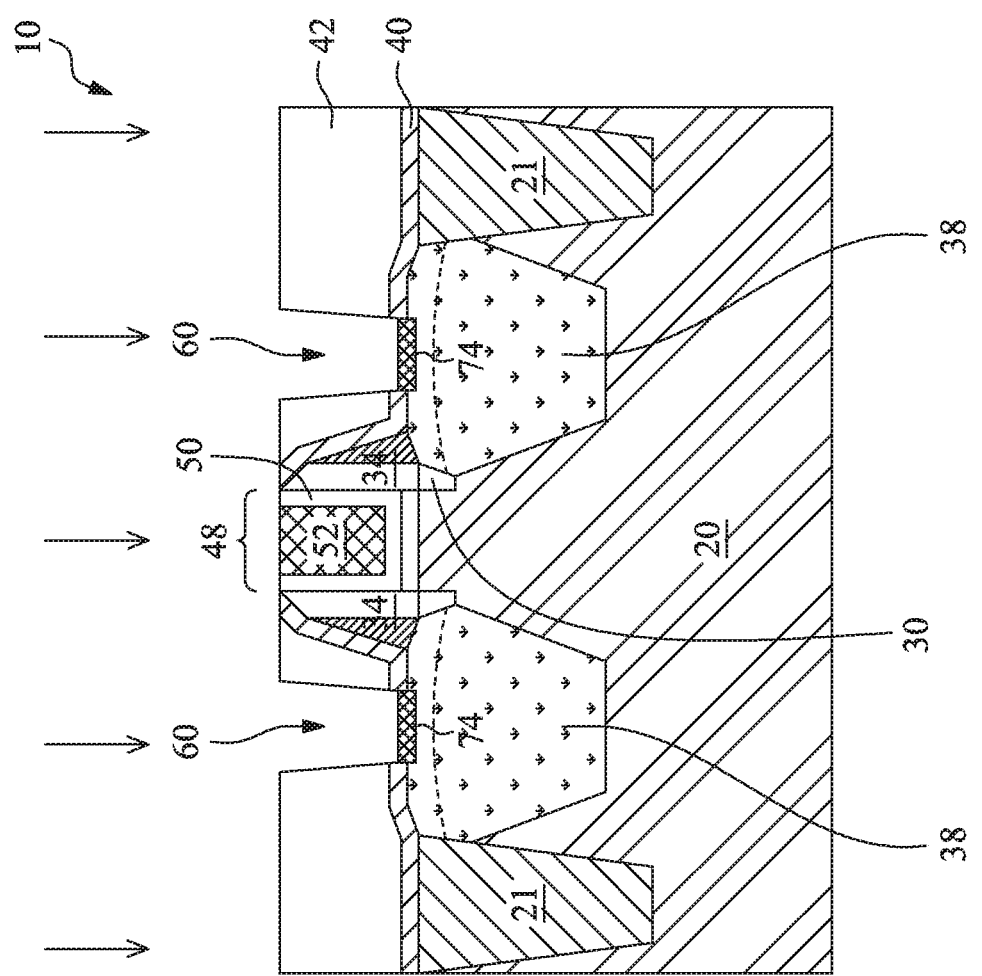

Next, an additional pre-clean may be performed, as shown in FIGS. 13 through 15. The respective step is shown as step 212 in the process flow in FIG. 22. The additional pre-clean may be performed using essentially the same process conditions, materials, and process gases as the pre-clean shown in FIGS. 8 through 10. Hence, the additional pre-clean is briefly discussed herein, and the details may be found referring to the discussion of FIGS. 8 through 10.

As shown in FIG. 13, a bombardment is performed on wafer 10, wherein surface regions 76 of ILD 42 and silicide regions 74 are bombarded. The sidewalls of contact openings 60 are not bombarded. Accordingly, regions 76 are more prone to adsorption than the sidewall portions of contact openings 60. Next, a chemical reaction is performed, for example, by introducing SiCoNi to react with oxide regions, as represented by Equation 1. Reaction layers 78 are thus generated, as shown in FIG. 14. FIG. 15 illustrates the decomposition (sublimation) and the removal of layers 78 in FIG. 14.

Figure 16:
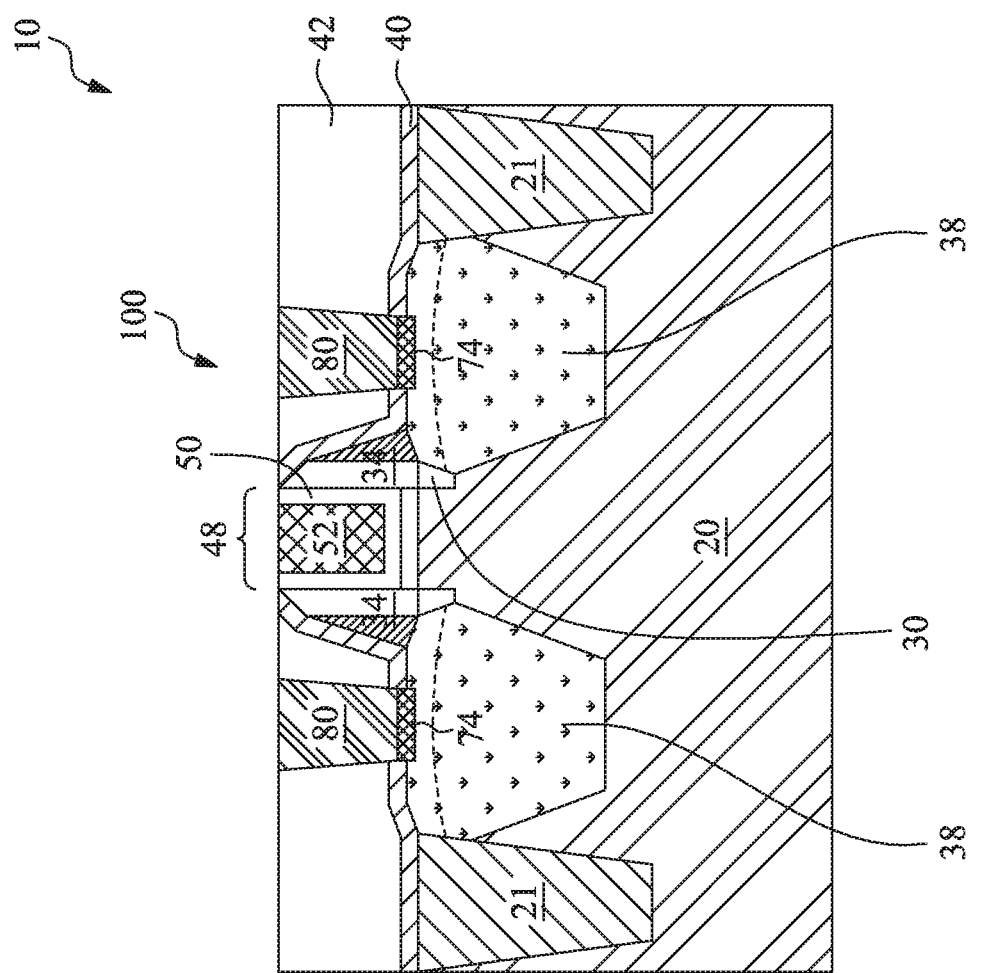

FIG. 16 illustrates the formation of contact plugs 80. The respective step is shown as step 214 in the process flow in FIG. 22. In accordance with some embodiments, the formation of contact plugs 80 includes filling a conductive material into contact openings 60 (FIG. 15), and performing a CMP to remove excess portions of the conductive material. The remaining portions of the conductive material form contact plugs 80. MOS device 100 is thus formed.

FIGS. 17 through 21 illustrate cross-sectional views of intermediate stages in the formation of silicide regions in accordance with alternative embodiments. Unless specified otherwise, the materials and the formation methods of the components in these embodiments are essentially the same as the like components, which are denoted by like reference numerals in the embodiments shown in FIGS. 1 through 16. The details regarding the formation process and the materials of the components shown in FIGS. 17 through 21 may thus be found in the discussion of the embodiments shown in FIGS. 1 through 16.

The initial steps of these embodiments are essentially the same as shown in FIGS. 1 through 7, wherein gate stack 22, source/drain regions 38, CESL 40, ILD 42, and contact openings 60 are formed, and source/drain regions 38 are exposed. In the formation of contact openings 60, the surface portions of ILD 42 may be damaged, causing the surface portions to be more prone to the adsorption of the process gases in the step shown in FIG. 9. This may cause the adsorption rate of the sidewall portions of ILD 42 not significantly lower than the adsorption rate of the bombarded regions at the surfaces of source/drain regions. Accordingly, an additional dielectric layer is formed to act as the surface layer of ILD 42.

Figure 17:
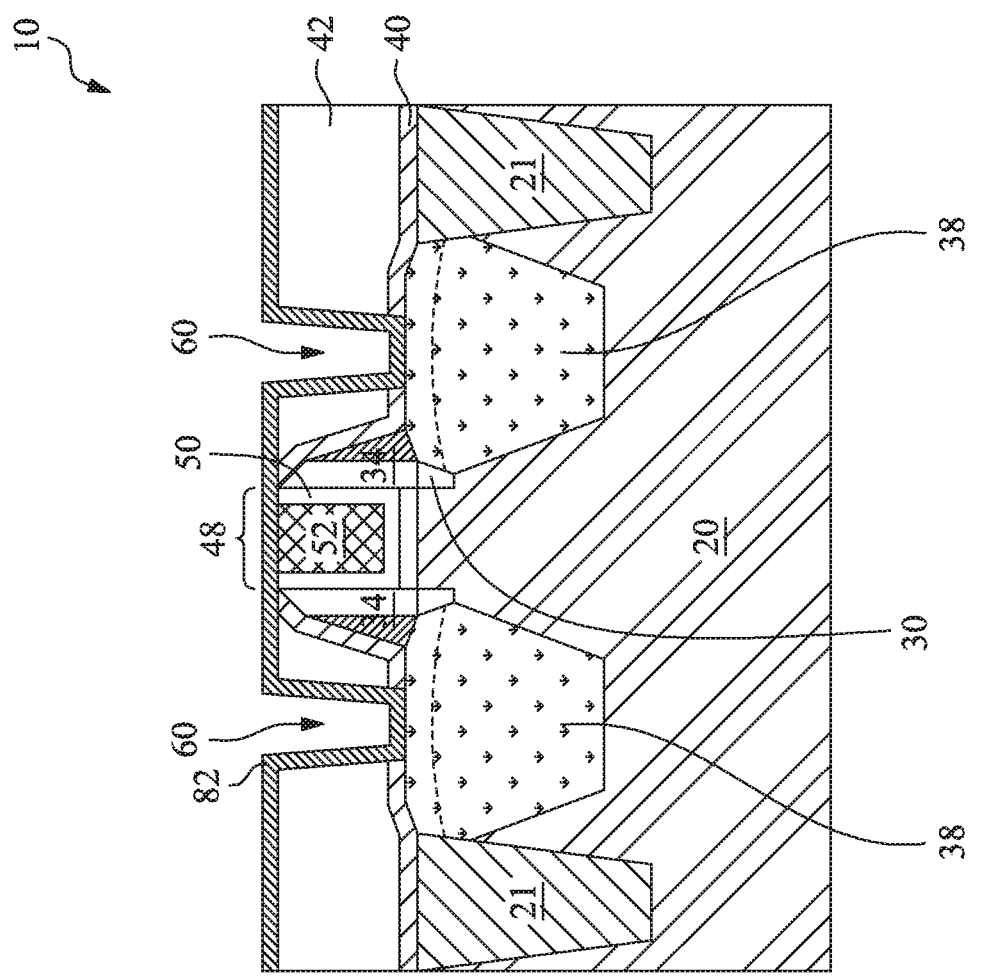
FIGS. 17 through 21 illustrate the cross-sectional views of intermediate stages in the formation of a MOS device in accordance with alternative embodiments.

As shown in FIG. 17, dielectric layer 82 is formed. The respective step is shown as step 216 in the process flow in FIG. 22. The box of this step is illustrated as dashed in FIG. 22 to indicate that this step may not be performed in some embodiments, for example, when ILD 42 is not damaged. Dielectric layer 82 is formed as a conformal layer, so that the sidewalls of contact openings 60 are protected by dielectric layer 82. In some embodiments, Atomic Layer Deposition (ALD) is used to form dielectric layer 82. In accordance with some embodiments, dielectric layer 82 comprises silicon oxide. In accordance with alternative embodiments, dielectric layer 82 comprises silicon nitride (SiN), SiCN, SiOCN, SiCN, SiOC, SiON or the like. For example, the corresponding reaction equation for silicon nitride may be expressed as:

$$HF + Si_3N_4 \rightarrow (NH_4)_2 SiF_6 \qquad [Eq. 3]$$

The thickness of dielectric layer 82 may be in the range between about 0.5 nm and about 10 nm. The material of layer 82 may be the same as or different from the material of ILD 42.

Figure 18:
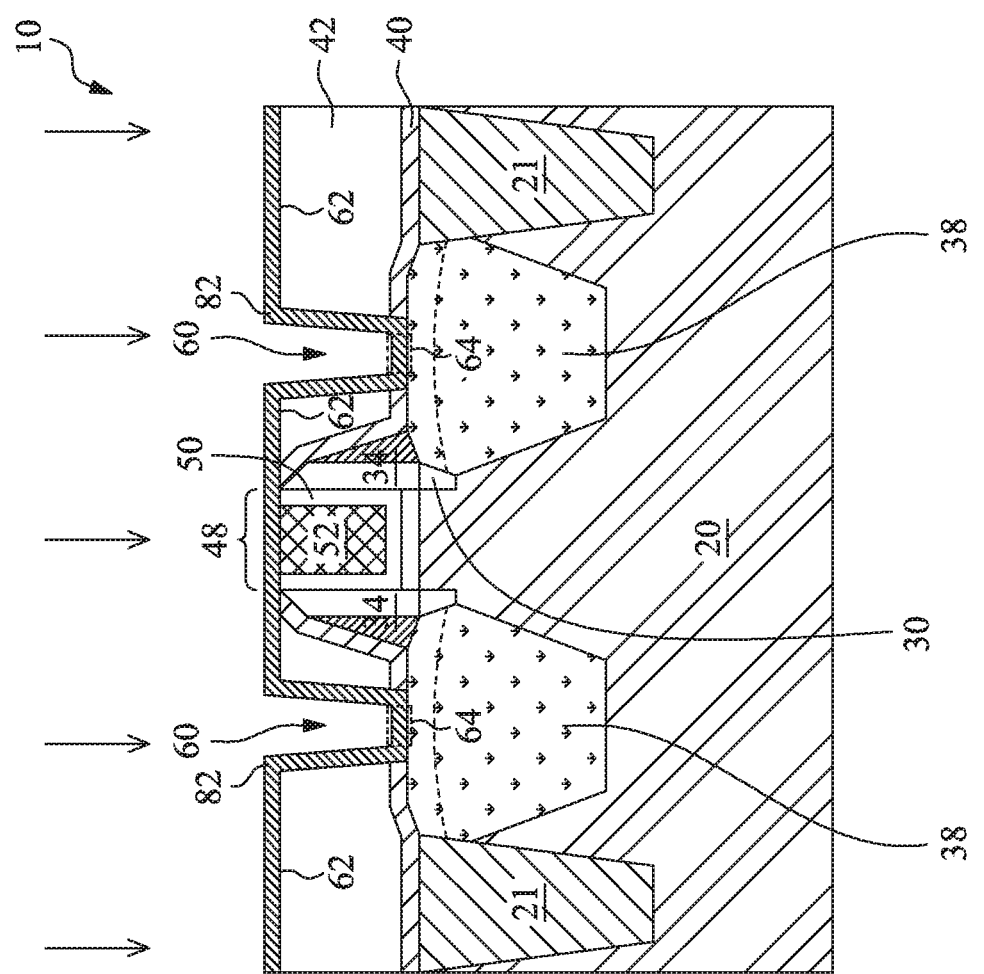

Next, as shown in FIG. 18, a bombardment is performed, which may be essentially the same as the bombardment shown in FIG. 8. In the bombardment, the horizontal surface portions of dielectric layer 82 are bombarded, and hence their adsorption rate is increased. On the other hand, the sidewall portions of dielectric layer 82 in contact openings 60 are not bombarded. Since dielectric layer 82 is not damaged and has a high quality, its adsorption rate is very low, and is lower than the adsorption rate of the damaged ILD 42.

Figure 19:
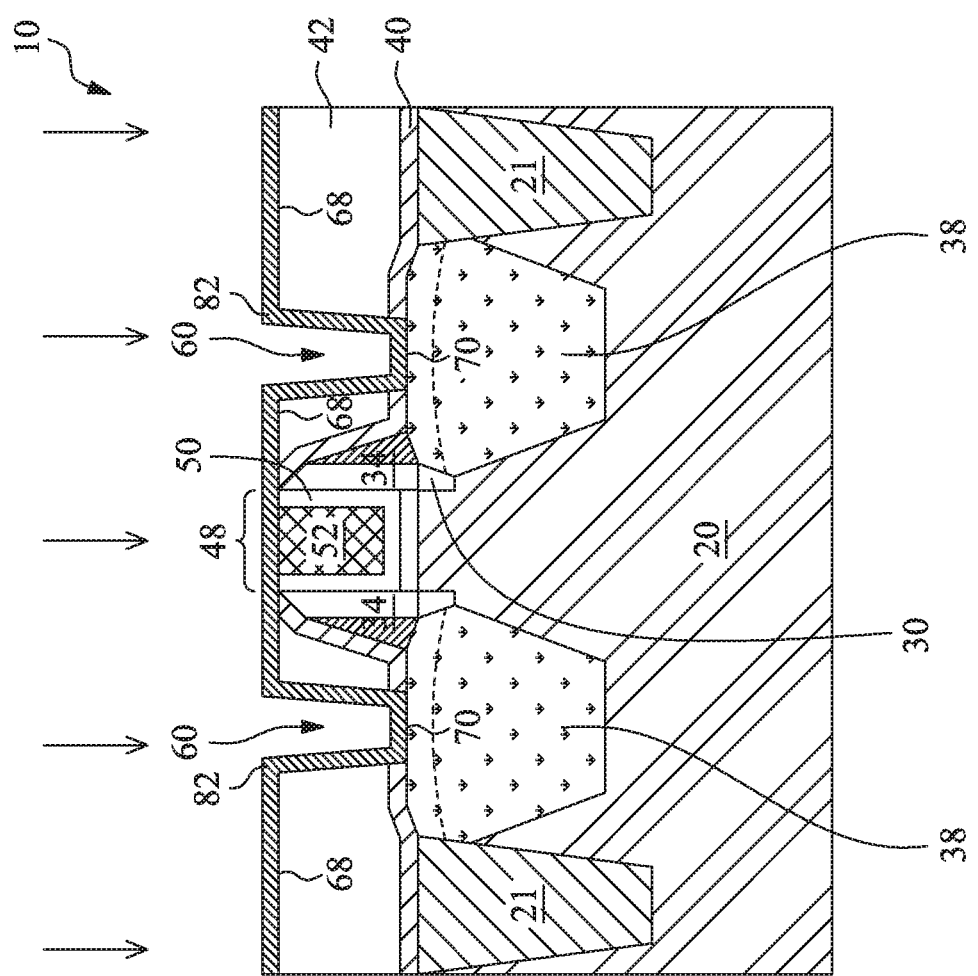

The bombarded regions 62 and 64 then react with a process gas(es) such as SiCoNi to form reaction regions 68 at the bottoms of contact openings 60 and to form reaction regions 70 on the top surfaces of ILD 42. The resulting structure is shown in FIG. 19. Since dielectric layer 82 is thin, at the bottoms of contact openings 60, besides dielectric layer 82, the native oxide on the surfaces of source/drain regions 38 also react reaction regions 70.

Figure 20:
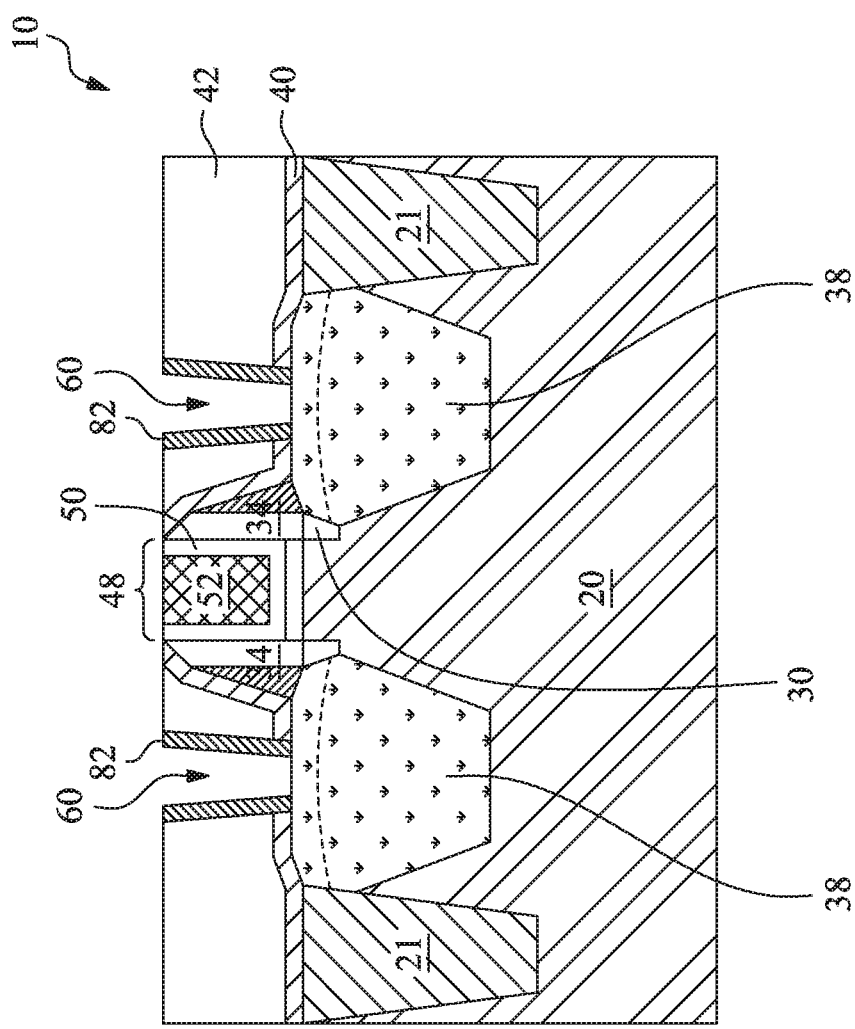
Figure 21:
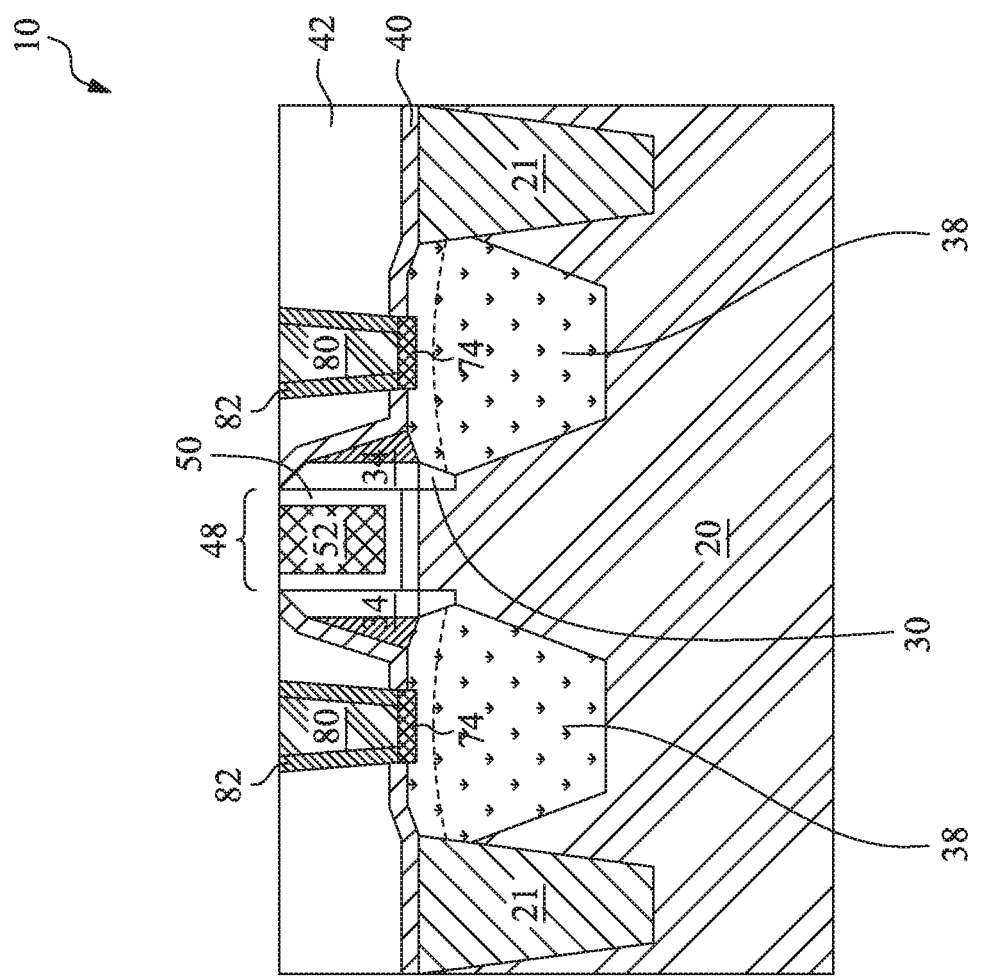

Next, reaction regions 68 and 70 are removed in a sublimation process. The resulting structure is shown in FIG. 20. The portions of dielectric layer 82 on the sidewalls of contact openings 60 may still have portions remaining in these embodiments. Next, the steps as shown in FIGS. 11 through 16 may be performed, and FIG. 21 illustrates the resulting MOS device 100, which includes the remaining portions of dielectric layer 82 encircling contact plugs 80.

In accordance with some embodiments of the present disclosure, the resulting MOS device 100 is a planar device. In accordance with alternative embodiments, the resulting MOS device 100 is a Fin Field-Effect Transistor (FinFET). In which embodiments, the top surfaces of the STI regions 21 may be at the level lower than the top surface of substrate 20, and gate stack 48 is formed on a semiconductor fin, which is the portion of semiconductor material over the top surfaces of STI regions 21.

The embodiments of the present disclosure have some advantageous features. By performing a bombardment and increasing the temperature in the chemical reaction for reacting oxide layers to form sublimation layers, the reaction of sidewall portions of the ILD exposed to contact openings is significantly reduced. As a result, the contact opening enlargement is significantly reduced. The process window in the pre-clean process is increased because the selectivity between sidewall portions and top surface portions of source/drain regions (and silicide regions) is increased. Experiment results indicate that by using a conventional pre-clean process, which does not include bombardment, and the respective chemical reaction is performed at 35° C., the enlargement of the contact openings is about 7 nm to 8 nm. As a comparison, when the process in accordance with the embodiments of the present disclosure is used, with the bombardment being performed, and the chemical reaction performed at 60° C., the enlargement of the contact openings is reduced to about 0.5 nm to 1 nm. Further increasing the temperature (of the chemical reaction) to be higher than about 60° C., the enlargement of the contact openings may be further reduced.

In accordance with some embodiments of the present disclosure, a method includes etching a dielectric layer to form an opening, with an underlying region underlying the dielectric layer exposed to the opening, and performing a bombardment to bombard a surface region of the underlying region through the opening. After the bombardment, the surface region is reacted with a process gas to form a reaction layer. An anneal is then performed to remove the reaction layer.

In accordance with alternative embodiments of the present disclosure, a method includes etching a dielectric layer to form an opening, with an underlying region underlying the dielectric layer exposed to the opening, and reacting the surface region with a process gas to form a reaction layer. The reaction layer includes a first portion at a bottom of the opening and overlying the underlying region, and a second portion on a top surface of the dielectric layer. Substantially no reaction layer is formed on sidewalls of the opening. An anneal is performed to remove the reaction layer.

In accordance with yet alternative embodiments of the present disclosure, a method includes etching an ILD to expose a source/drain region of a MOS device, performing a vertical bombardment to bombard a surface layer of the source/drain region, performing a reaction to react the surface layer with a process gas comprising $NF_3$ and $NH_3$, wherein a reaction layer is generated on a surface of the source/drain region, and performing an anneal to decompose the reaction layer. A silicide region is formed over the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a dielectric layer at a surface of a wafer to form an opening, with an underlying region underlying the dielectric layer exposed to the opening;
   performing a bombardment to simultaneously bombard a first surface region of the dielectric layer and a second surface region of the underlying region through the opening; and
   after the bombardment, reacting the first surface region and the second surface region with a process gas to form reaction layers, wherein during the reacting, the wafer is heated.

2. The method of claim 1, wherein the bombardment is performed vertically, with sidewalls of the dielectric layer facing the opening substantially free from the bombarded.

3. The method of claim 1, wherein the wafer is heated to a temperature higher than about 60° C.

4. The method of claim 1 further comprising performing an anneal to remove the reaction layer.

5. The method of claim 4, wherein the underlying region comprises a source/drain region of a Metal-Oxide-Semiconductor (MOS) device, and the method further comprises, after the anneal, performing a silicidation to silicide a surface portion of the source/drain region.

6. The method of claim 1, wherein the bombarding is performed using germanium.

7. The method of claim 1, wherein the underlying region comprises a source/drain silicide region of a Metal-Oxide-Semiconductor (MOS) device.

8. The method of claim 1, wherein the reacting the first surface region and the second surface region with the process gas comprises reacting with $NF_3$ and $NH_3$.

9. A method comprising:
   etching a first dielectric layer in a wafer to form an opening, with an underlying region underlying the first dielectric layer exposed to the opening;
   forming a second dielectric layer, wherein the second dielectric layer comprises:
      horizontal portions directly over an exposed portion of the underlying region and a horizontal surface of the first dielectric layer; and
      vertical portions on sidewalls of the opening;
   performing a bombardment to bombard the second dielectric layer; and
   reacting the second dielectric layer with a process gas to form a reaction layer.

10. The method of claim 9 further comprising performing an anneal to remove the reaction layer, wherein during the reacting, the wafer is heated so that the vertical portions of the second dielectric layer substantially do not react with the second dielectric layer.

11. The method of claim 10, wherein after the anneal, the vertical portions of the second dielectric layer remain in the opening, and the horizontal portions of the second dielectric layer are removed.

12. The method of claim 10 further comprising, after the anneal, siliciding a surface portion of the underlying region.

13. The method of claim 9, wherein the reacting the second dielectric layer is performed at a temperature higher than about 60° C.

14. The method of claim 9 further comprising filling the opening with a contact plug, wherein the contact plug is in contact with the vertical portions of the second dielectric layer.

15. The method of claim 9, wherein process gas comprises $NF_3$ and $NH_3$.

16. A method comprising:
   etching an Inter-Layer Dielectric (ILD) at a surface of a wafer to expose a source/drain region of a Metal-Oxide-Semiconductor (MOS) device through an opening;
   siliciding a surface portion of the source/drain region to form a source/drain silicide;
   performing a bombardment to bombard the source/drain silicide through the opening;
   introducing a process gas comprising $NF_3$ and $NH_3$ to react with an oxide in the ILD to form a reaction layer; and
   performing an anneal to decompose the reaction layer.

17. The method of claim 16 further comprising heating the wafer when the process gas is introduced.

18. The method of claim 16 further comprising, after the anneal, filling the opening with a conductive material to form a contact plug.

19. The method of claim 16, wherein the bombardment is vertical.

20. The method of claim 16, wherein the bombardment is performed using a process gas selected from the group consisting of argon, helium, nitrogen ($N_2$), hydrogen ($H_2$), xenon, arsenic, germanium, phosphorous, and combinations thereof.

* * * * *